United States Patent [19]

Greenstein

[11] 4,025,669
[45] May 24, 1977

[54] MULTIPLE PASS METHOD OF APPLYING PRINTING PASTE UPON A SUBSTRATE

[75] Inventor: Bernard Greenstein, Toledo, Ohio
[73] Assignee: Owens-Illinois, Inc., Toledo, Ohio
[22] Filed: Dec. 3, 1975
[21] Appl. No.: 637,448

Related U.S. Application Data

[62] Division of Ser. No. 415,948, Nov. 15, 1973, Pat. No. 3,975,201.
[52] U.S. Cl. .............................. 427/226; 427/123; 427/126; 427/229; 427/265; 427/266; 427/376 A; 427/376 B; 427/376 C; 427/376 H; 427/380; 427/376 E; 427/376 G
[51] Int. Cl.² ....................... B05D 3/02; B05D 5/12
[58] Field of Search .......... 427/226, 229, 379, 380, 427/375, 376 R, 376 A, 376 B, 376 C, 376 D, 376 E, 376 G, 376 H, 126, 265, 266

[56] References Cited

UNITED STATES PATENTS

| | | | |
|---|---|---|---|
| 3,331,801 | 7/1967 | Osmond et al. | 260/33.4 PQ |
| 3,625,733 | 12/1971 | Mansur | 117/46 CA |
| 3,661,615 | 5/1972 | Gray et al. | 117/46 CA |
| 3,779,807 | 12/1973 | Taylor et al. | 427/226 X |

Primary Examiner—Ronald H. Smith
Assistant Examiner—Evan K. Lawrence
Attorney, Agent, or Firm—Donald Keith Wedding; Richard B. Dence

[57] ABSTRACT

Multiple pass method of applying printing paste upon a substrate wherein the method includes the application upon a substrate of a printing paste composition containing an inorganic particulate material, a pyrolyzable organic binder and a solvent system for the organic binder which comprises a low boiling temperature solvent and a high boiling temperature solvent. The method includes the steps of applying a first layer of the printing paste composition and the thermal removal of substantially all of the low boiling temperature solvent, but not the high boiling temperature solvent or binder, prior to superimposing the next pass or layer of printing paste having the same characteristics as the first layer thereover. Following the application of the desired number of layers and removal of low boiling temperature solvent in this manner, the high boiling temperature solvent and the binder are thermally removed and the inorganic particulate material is fused to the substrate.

19 Claims, 1 Drawing Figure

MULTIPLE PASS METHOD OF APPLYING PRINTING PASTE UPON A SUBSTRATE

CROSS-REFERENCE TO RELATED APPLICATION

This is a division of application Ser. No. 415,948, filed Nov. 15, 1973, now U.S. Pat. No. 3,975,201.

BACKGROUND OF THE INVENTION

1. Field of the Invention

This invention relates to a vehicle comprising a binder and at least two solvents for the binder, a printing paste comprising the vehicle and a finely divided, particulate, inorganic coating material, and to the use of the vehicle and printing paste in multiple pass printing.

2. Description of the Prior Art

Particulate, inorganic coating materials are commonly used to seal glass of ceramic parts, such as lamina in a microelectronic package. Sealing is accomplished by applying the particulate material to a substrate, and firing the substrate at an elevated temperature to fuse, vitrify or crystallize the particulate material.

The particulate inorganic coating materials are conventionally applied to substrates by a wet process, that is, dispersed in a binder-solvent system. Such a process typically requires mixing the binder, the solvent and the particulate material to form a paste or slurry which is applied to the surface to be coated. The viscosity of the paste varies with temperature and with the particle size distribution of the inorganic material. Quality control is difficult and the solvent-binder technique is costly in time and material.

One effort to overcome the difficulties inherent in applying a coating or sealant to a substrate via a binder-solvent system is disclosed in U.S. Pat. No. 3,661,615 to Gray and Grier, the entire disclosure of which is incorporated herein by reference.

In U.S. Pat. No. 3,661,615, it is taught that some of the disadvantages inherent in prior art techniques can be avoided by preparing a polymeric based composition which can be used for coating or forming a film on a suitable substrate with incorporation of a solvent and without a change in viscosity and/or thixotropic character. The patent discloses a polymeric based composition containing finely divided, particulate, inorganic material dispersed in a low molecular weight, low vapor pressure, liquid polymer having a relatively constant viscosity and/or thixotropic character during heating of the composition, and which decomposes or pyrolyzes completely to gaseous products at a relatively low temperature without forming and/or leaving a noticeable carbonaceous or other like residue capable of direct and/or indirect deleterious effects. In a specific instance, the polymer is a polystyrene and/or a poly (alpha substituted) styrene having a molecular weight of less than about 1,000.

Unfortunately, the compositions disclosed in U.S. Pat. No. 3,661,615 have not proved entirely satisfactory, especially in the microelectronic package art where pastes are applied to substrates in multiple layers. In the microelectronic package art, the sealant cannot be applied in a single coat because of the difficulty in handling a single, relatively thick film. Rather, the particulate material is applied in several coats with a drying step interposed between each coating step. The solvent is removed from the paste during the drying step. In this manner, a coating of desired thickness is built up from several thin layers. This procedure is commonly referred to as multiple pass printing.

When the sealant is applied in several thin layers, it is essential that the layers adhere to one another. In order to obtain proper adhesion and reproducible products, each layer must be of proper wetness after being heated to remove solvent.

In many instances in which multiple pass printing is employed, a line, image or pattern is being printed, and resolution of the line, image or pattern is an important objective. If a layer is too wet after the heating step, the layer will be too tacky. Furthermore, a layer screened on top of a wet layer tends to slump and flow, thereby adversely affecting resolution of a line, image or pattern. Additionally, if the layer is too wet, pressure from the printing apparatus when a subsequent layer is applied causes the wet layer to compress and lose its shape. There can result a product having an improper thickness.

On the other hand, if each layer is too dry after evaporation of solvent, a layer subsequently screened on the dry layer will pull the dry layer away from its substrate when the printing screen is retracted. This is due to unsatisfactory adhesion between the dry layer and its substrate. Thus, proper wetness is required to obtain reproducible printings having good line resolution and proper thickness.

In the case of the use of the composition disclosed in U.S. Pat. No. 3,661,615, it is difficult to control the wetness of individual layers of sealant after the heating step employed in multiple pass printing.

U.S. Pat. No. 3,625,733 to Mansur suggests the incorporation of a cyclic isoprenoid solvent in the polymer based composition of Gray and Grier. The isoprenoid solvent enhances the wetness of individual layers of sealant in multiple pass coating. Nevertheless, the compositions suggested in U.S. Pat. No. 3,625,733 have not proved entirely satisfactory, especially in the microelectronic package art because of the drying and firing cycles employed in this art. For example, a paste containing the particulate material which is to function as the sealant is applied in a relatively thin layer to a ceramic substrate. The coated substrate is then subjected to a drying step at about 120°–200° F. for about 5–10 minutes to remove solvents in the paste. A second coat of the paste is then applied, and the drying step is repeated. This sequence of steps involving application of paste followed by drying can be repeated until the desired thickness of sealant is obtained.

It has been discovered that some of the cyclic isoprenoid solvents are too temperature sensitive during the drying step (i.e., 120°–200°F.), making it difficult to obtain the desired wetness between layers of sealant. The difficulty is apparently due to the vapor pressure of the isoprenoid solvents frequently employed in printing pastes for microelectronic packages. Because of the vapor pressure of these isoprenoid solvents, their rates of evaporation are difficult to control. For example, at the low end of the range of 120°–200° F., the evaporation rate is frequently too low, resulting in the removal of too little solvent during the 5–10 minute heating period. At the upper end of the temperature range, on the other hand, the evaporation rate is sometimes too great. In the first instance, the sealant layer is too wet for subsequent coating, while in the latter event, the layer is too dry. The temperature of the drying apparatus can vary over the range of about 120°–200° F. because of such factors as the number of products per unit time fed to the apparatus, the temperature of the products entering the apparatus, room temperature, whether the products are on trays which will absorb heat, etc.

There are several other problems in the printing paste art which must be considered. Not only must the printing paste for multiple pass printing exhibit relatively constant solvent evaporation characteristics during the drying step, but the paste should have a substantially uniform wetness over its entire surface after the drying step. Further, the paste should flow as little as possible in the absence of pressures above atmospheric pressure in order to avoid contact with undesired areas and to maintain resolution of a line, image or pattern. Additionally, the paste should have as few voids as possible in order that it can be fired to form a strong, hermetic seal.

Thus, it is apparent that there exists a need in the art for an improved printing paste and printing paste vehicle. The printing paste should be suitable for applying a particulate material in several layers on a substrate. It should also be suitable for use where a drying step is interposed between coats. It is desirable that the rate of evaporation of solvents be susceptible to control during such a drying step in order to obtain suitable wetness between layers. It is especially desirable that the rates of evaporation of solvents be substantially constant during a drying step of about 120°–200° F. for about 5–10 minutes. Above all, the paste should have the viscosity, thixotropy and flow characteristics required for the desired use.

Summary of the Invention

Accordingly, this invention provides an improved liquid vehicle. The liquid vehicle comprises a thermally stable binder and at least one low boiling point solvent for the binder. The term "low boiling point solvent" means an organic solvent having a vapor pressure of less than about 2 mm Hg at a temperature of about 20°–25° C., and a vapor pressure of about 2–100 mm Hg at about 120°–200° F. The improvement comprises combining at least one of the low boiling point solvents together with a high boiling point solvent. The term "high boiling point solvent" means an organic solvent having a vapor pressure of about 1 mm Hg or less at a temperature of about 120°–200° F. and a vapor pressure of about 2–100 mm Hg at a temperature within the range of above about 200° to about 400° F.

This invention also provides an improved printing paste comprising the improved vehicle of this invention is combination with at least one finely divided, particulate inorganic material.

Additionally, this invention provides for the use of the printing paste of this invention in multiple pass printing in which a first coat of the paste is applied to a substrate, and the substrate subsequently heated to substantially remove all of the low boiling point solvent. The paste application and substrate heating steps in sequence can each be repeated at least one additional time, usually until a coating of desired thickness is built up from at least two thin layers. The substrate is then heated to substantially remove all of the high boiling point solvent and binder. The substrate is heated to fuse, vitrify or crystallize the particulate inorganic material.

Further, this invention provides for the use of the printing paste of this invention in the manufacture of a microelectronic package sub-assembly. It employs multiple pass printing and comprises screening a first coat of the paste on a ceramic substrate and heating the substrate at about 120°–200° F. for about 5–10 minutes to substantially remove all of the low boiling point solvent. The sequence of paste application and substrate heating steps is repeated about 2–4 times. The substrate is heated to about 200° F. to about 400° F. for about 5–10 minutes to substantially remove all of the high boiling point solvent. The binder is pyrolyzed, and the inorganic particulate material fused to the substrate.

BRIEF DESCRIPTION OF THE DRAWING

Other purposes, features and preferred details of this invention will become apparent from the accompanying drawing in which.

DESCRIPTION OF THE PREFERRED EMBODIMENTS

As used herein, the expression "liquid vehicle" is intended to refer to a conventional binder in solution, wherein the vehicle is in a liquid state over a relatively wide temperature range, such as about 20°–300° C.

The binder employed in this invention can be any well known organic binder useful in printing pastes. Mixtures of binders can also be employed. The binder adds "green strength" to the improved paste of this invention. It acts as an agent which holds the particulate material together during the interval between evaporation of solvent and removal of binder. The binder must be thermally stable at temperatures below about 200° F. in order that it will be capable of performing its function during and after removal of the low boiling point solvent. By "thermally stable" is meant that the binder does not substantially vaporize, decompose and/or pyrolyze at temperatures below about 200° F. Generally, at room temperature (e.g., about 25° C.) the binder will be a solid or a very viscous liquid. Preferably, the binder will pyrolyze at about 150°–400° C. If higher temperatures are required, the binder may be entrapped in the particulate material and later bubble out when the particulate material is being fired. The integrity of the resulting film may be adversely affected. The term "pyrolyze" means that the binder decomposes to form gaseous products without passing through a broad liquid range and without leaving a noticeable carbonaceous or other like residue which would interfere with the intended function of the system.

The binder can be a low molecular weight, low vapor pressure polymer which decomposes or pyrolyzes practically completely. Preferred binders are the polystyrene and/or poly (alpha substituted) styrenes having molecular weights less than about 1,000 preferably about 250–1,000, and disclosed in U.S. Pat. No. 3,661,615. Particularly preferred is a poly (alpha-methyl) styrene having a water white color, a boiling range (5% to 90%) at 5 mm Hg of about 150°–300° C., a specific gravity at 60/60° C. of about 1.01, a refractive index at 60° C. of about 1.58 and a molecular weight of about 250–1,000. This polymer fulfilling these criteria is marketed under the trade name Dow Resin 276-V2 by the Dow Chemical Company of Midland, Michigan.

Another preferred class of binders are the acrylate and methacrylate polymers, such as the Elvacite's marketed by E. I. duPont deNemours and Co. of Wilmington, Delaware. A particularly preferred binder within this class is an n-butyl methacrylate polymer marketed under the tradename Elvacite 2044.

Typical of other binders are pyrolyzable polymers such as polyethers, including poly (tetrahydrofuran), poly (1,3-dioxalane), and poly (alkylene oxides), especially poly (ethylene oxide) or poly (propylene oxide); poly (alkyl methacrylates) including those where the alkyl group contains about 1-6 carbon atoms, especially poly (methyl methacrylate), poly (ethyl methacrylate); methacrylate copolymers including methyl methacrylate/n-butyl methacrylate copolymers, styrene copolymers, n-butyl methacrylate/alpha methyl styrene copolymers, methyl methacrylate/styrene copolymers, methyl methacrylate/dimethyl itaconate polymers; polyisobutylene; poly (trimethylene carbonate); poly (ethylene carbonate); poly (propylene carbonate); poly (ethylene oxalate); vinyl toluene/alpha methyl styrene copolymers; styrene/alpha-methylstyrene copolymers; olefin-sulfur dioxide copolymers; dipolymer, terpolymer or tetrapolymer of oxygen and at least one monomer of alkyl methacrylate with the alkyl group containing one to six carbon stoms, e.g., methyl to hexyl, preferably butyl; and copolymers of oxygen with other vinyl monomers. The use of ethyl cellulose binders is to be avoided since they generally leave an undesirable residue after thermally decomposing. The solvents employed in practicing this invention are organic compounds which are liquid at temperatures of about 25° C. Optionally, both the low boiling point solvent and the high boiling point solvent can be solvents for the binder. Nevertheless, it is only necessary that either the low boiling point solvent or the high boiling point solvent be a solvent for the binder provided that the other solvent is compatible with the binder solution. This proviso is generally fulfilled if the non-solvent for the binder is miscible with the binder solution. The low boiling solvent and the high boiling point solvent must substantially evaporate or thermally decompose (without leaving a residue) within the temperature ranges of about 120°–200° F. and above about 200° F. to about 400° F., respectively.

Viscosity of a printing paste is very critical in obtaining a print having the desired film thickness and pattern resolution. If solvent evaporates, the viscosity will generally change. Thus, the low boiling point solvent must not evaporate substantially at printing temperatures. Accordingly, the low boiling point solvent has a vapor pressure less than about 2 mm Hg at ambient temperature of about 20°–25° C. Also, the low boiling point solvent has a vapor pressure of about 2–100 mm Hg at about 120°–200° F. this assures that the low boiling point solvent will substantially completely evaporate or decompose within the heating range of about 120°–200° F. It also assures that the low boiling point solvent will not boil within this heating range. Boiling of any and all solvents is to be avoided since it disrupts the coating. Generally speaking, the low boiling point solvent will, in most cases, also have a boiling point at atmospheric pressure of about 180° C. or more. Solvents having boiling points below about 180° C. at atmospheric pressure generally evaporate too rapidly.

It will be understood that mixtures of low boiling point solvents can be employed.

Typical of the low boiling point solvents are the cyclic isoprenoid solvents referred to in U.S. Pat. No. 3,625,733. The entire disclosure of this patent is incorporated herein by reference. A preferred solvent is a mixture of isomeric terpineols composed predominantly of alpha-terpineol with minor amounts of beta-terpineol and gamma-terpineol, and characterized by a specific gravity of 0.937 and a refractive index of 1.481. This terpineol mixture is marketed by Hercules, Inc., Pine and Paper Chemicals Department, Wilmington, Delaware, at Hercules Terpineol 318. This solvent is particularly effective with the Dow Resin 276-V2 and the poly (n-butyl methacrylate) (i.e., Elvacite 2044).

Typical of other low boiling point solvents are the following:

TABLE I

| SOLVENT | BOILING POINT AT 760 mm Hg |
|---|---|
| α Propylene glycol | 187.4° C. |
| Benzyl alcohol | 205.5° C. |
| 2 (2-Ethoxyethoyx)-ethanol (Diethylene glycl monoethyl ether | 196° C. |
| Glycol (1,2-Ethanediol | 197.85° C. |
| d,1-1,3-Butanediol | 207.5° C. |
| 2,3,6-Trimethylcyclohexanol | 193–195° C. |
| α-Isopropylbenzyl alcohol | 222–224° C. |
| Diethylene glycol mono-n-butyl ether | 228–230° C. |
| Carbitol acetate | 217.4° C. |
| Butyl cellosolve acetate | 192.3° C. |
| Diethylene glycol monomethyl ether | 194° C. |
| Triethylene glycol dimethyl ether | 216° C. |
| Methyl Thymyl ether | 216° C. |
| 4-Isopropylbenzaldehyde | 236° C. |
| 1-Phenoxy-2-propanone | 229–230° C. |
| Phenol isobutyl ketone | 235° C. |
| Glycol diacetate | 190.9° C. |
| 2 Ethylhexyl acetate | 198.5° C. |
| Isodecyl alcohol | 215–225° C. |
| n-decyl alcohol | 216–221° C. |
| Ethylene glycol | 197–204° C. |
| Dipropylene glycol | 231–238° C. |
| Solvent DE acetate (Toledo Solvents) | 214–221° C. |
| 2 ethyl Hexyl octyl acetate | 192–205° C. |
| Isophorone | 215–220° C. |
| Diethylene glycol n-butyl ether | 230° C. |

The high boiling point solvent employed in this invention has a vapor pressure of about 1 mm Hg or less at a temperature within the range of about 120°–200° F. and a vapor pressure of about 2–100 mm Hg at a temperature within the range of above about 200° to about 400° F. Mixtures of these solvents can also be employed. The vapor pressure of about 1 mm Hg or less at about 120°–200° F. assures that the high boiling point solvent will not evaporate substantially while the low boiling point solvent is being evaporated The vapor pressure of about 2–100 mm Hg at above about 200° to about 400° F. assures that the high boiling point solvent will substantially completely evaporate or decompose within the heating range of above about 200° F. to about 400° F. It also assures that the high boiling point solvent will not boil within this heating range.

A preferred high boiling solvent for use in a Dow Resin 276-V2 Terpineol 318 system is a polypropylene glycol having an average molecular weight of about 200 or 400 (hereinafter referred to as P-200 and P-400, respectively), or mixtures of such polypropylene glycols. A preferred solvent for use in a poly (n-butyl methacrylate)/Terpineol 318 system is diisobutyl adipate. The diisobutyl adipate can also be employed in a Dow Resin 276-V2 /Terpineol 318 system.

P-200 is available as a product comprised mainly of tripropylene glycol having a molecular weight of 192.3. P-400 is available as a polymer having a molecular weight of 400. Typical of other high boiling point solvents are the following:

TABLE II

| SOLVENT | DISTILLATION USAGE At 760 mm Hg |
|---|---|
| Triethylene glycol | 286–300° C. |
| Glycerine synthetic | 290° C. |
| Mineral seal oil | 270–327° C. |
| 2-Benzyloxyethanol (Ethylene glycol monobenzyl ether) | 265° C. |
| Phenyl n-hexyl carbinol | 275° C. |
| 3,4 Dimethoxy benzyl alcohol | 296–297° C. |
| Methyl-3-hydroxybenzoate | 280° C. |
| 4-Acetylphenol (4-hydroxyacetophenone) | 296° C. |
| 2,4-Dihydroxytoluene (4-methylresoicinol) | 267.7° C. |
| 3,5-Dihydroxytoluene Ethyl-4-hydroxybenzoate | 297–298° C. |
| 2-Naphthol (p-Naphthol) | 286° C. |
| Tetraethylene glycol dimethyl ether | 266; 275° C. |
| 3,4-Diethoxybenzaldehyde | 277–280° C. |
| Isoamylsalicylate | 276–278° C. |

Any finely divided, particulate inorganic coating material can be incorporated in the improved vehicle of this invention in order to obtain the improved printing paste. By "finely divided, particulate, inorganic material" is meant an inorganic, conductive or nonconductive material, in finely divided form, which can be applied to a substrate in the form of a coating, which can be fused, sintered, or crystallized at temperatures above about 200° F. The choice of such materials is virtually unlimited. Suitable materials include by way of example and not limitation, oxides such as silica, alumina and boric oxide; decorative glazes which are glassy compositions containing low melting compounds or fluxes, such as the alkali metal oxides, boric oxide and lead oxide; electron emissive compounds, such as the carbonates of barium, strontium and calcium; metals and metalic alloys, such as copper, gold, silver, nickel, platinum, etc.; glasses in general, thermally crystallizable glasses, solder glasses, and mixtures of same.

In a preferred embodiment of this invention, the inorganic coating material is solder glass. Solder glasses are well-known in the art and are used to seal glass or ceramic surfaces to glass, ceramic or metallic parts. They are also used to coat substrates, especially electrical components such as microcircuits. Vitreous and devitrifiable solder glasses are known in the art and are commercially available. Both types of solder glasses can be used in practicing this invention. Exemplary solder glasses for use in the present invention are disclosed in U.S. Pat. Nos. 2,866,298; 2,931,142; 2,936,923; 3,061,644; 3,063,198; 3,080,328; 3,088,834; 3,088,835; 3,127,278; 3,250,631; 3,291,586 and 3,368,024; all assigned to the assignee of this invention. The solder glass may be used alone or mixed with other inorganic material such as a glass ceramic.

The proportions of the binder, solvents and dispersed inorganic material can vary over a broad range depending upon the intended use and required viscosity for the coating composition. Usually, the binder is employed in an amount at least sufficient to serve as an adequate vehicle for carrying the quantity of particles required for a particular use, for example, to provide good coating characteristics in the green (unfused or unsintered) state when the particles are applied to a substrate.

For use in preparing microelectronic packages of the type hereinafter described, the improved vehicle of this invention will generally comprise about 10–35 weight percent binder, about 30–70 weight percent of the low boiling point solvents and about 20–40 weight percent high boiling point solvents. Typical compositions are set forth in TABLE III.

TABLE III

| (Weight Percentages) | | | | | | | | |
|---|---|---|---|---|---|---|---|---|
| | (1) | (2) | (3) | (4) | (5) | (6) | (7) | (8) |
| 276-V2 | 10 | 10 | 20 | 20 | 30 | 30 | 30 | 30 |
| Terpineol 318 | 70 | 50 | 40 | 40 | 40 | 40 | 40 | 35 |
| P-200 | 20 | 20 | 20 | 40 | 0 | 15 | 30 | 0 |
| P-400 | 0 | 20 | 20 | 0 | 30 | 15 | 0 | 0 |
| Diisobutyl Adipate | 0 | 0 | 0 | 0 | 0 | 0 | 0 | 35 |

A further example is a vehicle comprising about 50 weight percent Terpineol 318 and about 50 weight percent of a mixture of poly (n-butyl methacrylate) and diisobutyl adipate wherein the weight ratio of diisobutyl adipate to poly (n-butyl methacrylate) is about 3:1.

The weight ratio of high boiling point solvents to low boiling point solvents in the vehicle will typically be about 1:1.8–1.8:1, preferably about 1:1.2–1.2:1, most preferably about 1:1.

When used in the manufacture of the microelectronic packages of the type described hereinafter, the improved paste of this invention will generally comprise about 80–92 weight percent, preferably about 88 weight percent, of the finely divided, particulate, inorganic coating material, and about 8–20 weight percent, preferably about 12 weight percent, of the improved vehicle of this invention. These proportions have been found to be desirable for the viscosities and particle sizes set forth hereinafter with respect to the microelectronic art.

The improved printing paste of this invention generally has a viscosity of about 30,000–100,000 centipoise. For most cases the viscosity will be about 35,000–60,000 cps. In the manufacture of microelectronic packages, the viscosity is preferably about 38,000–46,000 cps. All viscosity measurements refer to values as determined using a standard Brookfield RVT-Helipath Model C viscometer at a sheer rate of 50 rpm with a TE spindle and a measurement temperature of 73° F.

It has been found that the preferred solvents employed in this invention provide the required constant drying characteristics without adversely affecting viscosity and flow properties of the improved paste when employed in the manufacture of microelectronic packages of the type described below.

The coating composition may be applied to any suitable substrate having any geometric configuration or shape. However, the full advantages of this invention are typically obtained when the composition is applied to a substantially flat surface, e.g., such as a ceramic substrate. However, such surface may contain notches, grooves, or other irregularities for enhancement of the bond between the coating and the substrate.

The substrate may comprise a wide range of magnetic and non-magnetic materials including glass, ceramic, glass ceramic, metal, carbon, plastic, and mixtures thereof such as ceramic-metallic composites, i.e., cermets. Metal as used herein is intended to include metalloids as well as metal and metalloid oxides. Examples of same include silicon, aluminum, titanium, zirconium, etc., as well as alloys and oxides thereof. If plastic is used for the substrate, it must be capable of taking the heat cycle, e.g., such as some of the high temperature stable polyaromatics.

In addition, the printing paste of this invention can comprise other ingredients such as wetting and/or leveling agents which pyrolyze cleanly.

The printing paste of this invention may be applied to the substrate by any suitable means or technique including extrusion, blade coating, spraying, dipping, and printing methods such as silk screening. Silk screening is especially suitable for applying the printing paste as thin lines on a substrate, e.g., as electrode lines in the form of finely divided fused conductive material, such as gold or silver, on the glass substrate of a gaseous discharge display/memory device. Likewise, such thin lines, conductive or non-conductive, continuous or non-continuous, can be applied to the substrate by means of line printing apparatus.

Although the printing paste of this invention can be applied to the substrate in a single step, e.g., by one of the aforementioned techniques, it is contemplated that such step may be repeated so as to build up the thickness of the layer on the substrate. Thus, in one embodiment hereof, the printing paste of this invention is applied to the substrate, suitably dried, and the sequence repeated several times, e.g., 2 to 8 times, until a desired green state coating thickness, e.g., about 4 to 20 mils, is obtained. The built-up coating (comprised of multiple dried layers) is then suitably cured by heating, e.g., in one or more ovens, so as to pyrolyze the binder and fuse the inorganic material. In such multiple layer embodiment, the drying of the applied coating is typically by means of radiant heat, e.g., infra-red, in an amount sufficient to dry the top (exposed) portion of the coating without fusing the inorganic material.

The particle size of the solid, inorganic material may vary over a wide range, e.g., from very fine to very coarse. Typically, the finer the particles, the greater the surface area and the greater the proportion of vehicle which is required to obtain a paste having a given viscosity.

This invention will now be described with reference to a particularly preferred embodiment, that of a subassembly, whose ultimate use is usually in the encapsulation of a medium scale or large scale integrated circuit, such as a metal oxide semiconductor circuit located within a silicon chip. While this preferred embodiment is hereinafter discussed, it is understood that this invention is especially useful in the manufacture of all microelectronic packages wherein an electronic device is encapsulated within the package.

Figure 1:
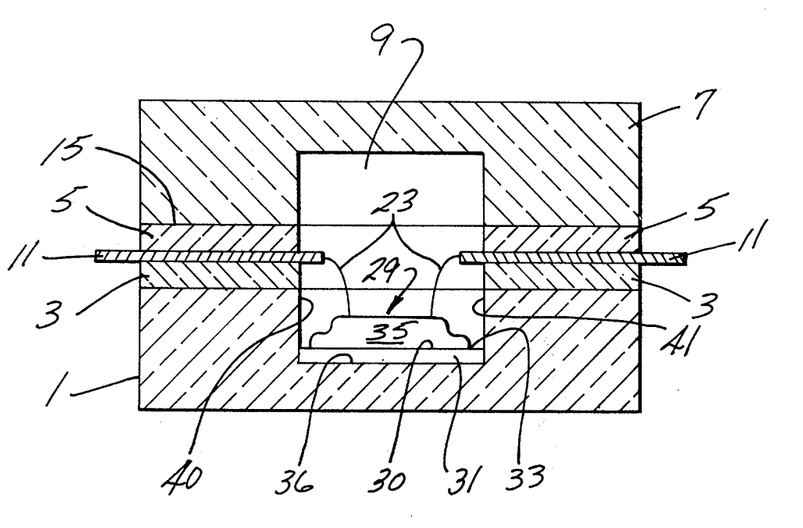
The FIGURE is a side sectional view of a hard glass sealed microelectronic package comprised of laminae bonded together by means of the use of the improved vehicle and printing paste of this invention.

Referring to the FIGURE, there is illustrated a typical microelectronic package well-known in the art. Such a package is comprised of a ceramic base 1 and a cavity 9. The ceramic base is generally a pre-fired flat ceramic which will not substantially change size during further manufacturing. The package is provided with a sealing glass layer 3, electrical leads 11, another sealing glass layer 5, and a ceramic lid 7. The ceramics are typically alumina. The cavity is defined by a bottom 36 and sidewalls 40 and 41 substantially perpendicular to the bottom 36.

Electrical leads 11 terminate in the cavity 9. Leads 11 are connected by microconnections or other leads 23 with a microelectronic component generally represented as 29.

Leads 11 can be located within sealing glass layers 3 and 5 by any conventional technique. As illustrated, leads 11 are within layers 3 and 5. Leads 11 can be provided by means of a lead frame comprising an external frame member and a plurality of leads 11 which radiate from a central location outwardly to the frame member.

Generally speaking, the microelectronic component 29 is required to be hermetically sealed within cavity 9. Therefore, lid 7 is generally hermitically sealed to the layer 5 by firing at an elevated temperature. Firing can be carried out by heating the package, for example, in a furnace provided with means to convey the package therethrough, to the sealing temperature of the sealing glass provided in layers 3 and 5.

Microelectronic component 29 comprises a base lamina 31 which has a layer of gold on its surface 30. Typically, the gold layer is formed from a composition comprising gold and a glass binder. The composition is fired at a temperature and for a period of time sufficient to result in a major portion of the gold migrating to surface 30, while a major portion of the glass binder migrates to the bottom 36 of the cavity 9. Base lamina 31 is bonded eutectically to a silicon chip 35 containing a delicate integrated electronic circuit (not shown for convenience). Fillet 33 indicates the presence of a eutectic bond.

The ceramic base 1 is generally only about ¾ inch long and ¼ inch wide. The portion of cavity 9 in ceramic base 1 is generally only about 110 mils wide by 40 mils long and about 5–10 mils deep. Thus, it is readily apparent that close control of conditions during the various coating, drying and firing operations is required if a reproducible, high quality package is to be obtained.

Typically, sealing glass layers 3 and 5 are each only about 17–19 mils in their dry, unfired state (i.e., thickness after heating at about 120°–200° F. for about 5–10 min.), and each about 11–13 mils after firing. Sealing glass layer 3, for for example, is applied to ceramic base 1 in the improved printing paste of this invention containing the sealing glass in particulate form. Sealing glass layer 3 cannot be applied in a single coat to ceramic base 1 because the printing paste tends to slump and flow in a wet, single coat thickness of about 17–19 mils. Furthermore, it is very difficult to apply a single coat 17–19 mils thick without paste flowing into cavity 9 and down the external sidewalls of ceramic base 1. Screen clogging in single pass printing of layers 17–19 mils thick is common, and is due to the very high viscosities of the pastes required.

In order to avoid these problems, sealing glass 3 is applied in several layers, each sufficient to yield a dried thickness of about 5–6 mils (i.e., the thickness after heating at about 120°–200° F. for about 5–10 minutes). This is typically accomplished by placing ceramic base 1 on a moving conveyor. A layer of the improved printing paste of this invention containing sealing glass 3 in particulate form is deposited on ceramic base 1 by silk-screening techniques well-known in the art. The ceramic base 1 is then passed through a heating chamber, such as an oven provided with infrared lamps or other heating means, where the ceramic base 1 is heated to about 120°–200° F. for about 5–10 minutes. This heating step results in evaporation of substantially all of the low boiling point solvent. The ceramic base then exits from the heating chamber, and is cooled to less than about 90° F. Generally speaking, cooling to about 65°–75° F. is preferred. A second layer of the improved printing paste of this invention is deposited by silk-screening on the first layer of paste which now has the proper wetness by virtue of the evaporation of the low boiling point solvent. After the second coat is subjected to a similar heating step of about 120°–200° F. for about 5–10 minutes, subsequent coats can be applied and dried. The number of printing paste applications and heating steps will be dictated by the thickness of each coat and the total sealing glass thickness desired. Typically, about 3 coats yield a sealant layer having a fired thickness of about 11–13 mils. Optimum procedures can be determined with a minimum of experimentation.

After the application and heating of the last coat to be applied, the higher boiling point solvent will have fulfilled its function of providing the proper degree of wetness between layers of paste. Thus, the higher boiling point solvent can be removed by heating ceramic base 1 at above about 200° tp about 400° F. for about 5–10 minutes.

Similarly, after the binder has served its purpose of providing the required green strength, it can also be removed. In most cases, this is conveniently accomplished by heating the binder at about 150°–400° C. for about 5–20 minutes.

Sealing glass layer 3 is generally fused to ceramic base 1 to form a microelectronic package sub-assembly. This is accomplished by heating the coated ceramic base at an elevated temperature. In the case of a crystallizable sealing glass, this firing step is conducted at a temperature and for a time below the point at which substantial crystallization occurs. Removal of the high boiling point solvent and binder are conveniently combined with this firing step. Thus, for example, the coated substrate can be heated to about 300° C. within about 5–10 minutes to remove the high boiling point solvent. It is then held at about 300°–350° C. for about 10–15 minutes to pyrolyze the binder. The temperature is subsequently raised to a peak of about 350°–450° C. for a short time to fuse the sealing glass to the substrate. A glazed surface on the coated ceramic base results. The coated ceramic base is then cooled to ambient temperature (e.g., about 25° C.) within about 5–10 minutes. The entire firing cycle is generally conducted in about 30 minutes and in air, although some sealing glasses may require special atmospheric conditions as those skilled in the art will recognize.

Base lamina 31, silicon chip 35, leads 11 and microconnections 23 are installed in the conventional manner.

Before being placed on the microelectronic package, lid 7 is provided with sealing glass layer 5 in a manner similar to the application of sealing glass layer 3 on ceramic base 1. The microelectronic package is assembled by inverting lid 7 after the coating and firing operations, and placing the lid over leads 11 in the position shown in the FIGURE.

The assembled microelectronic package is then fired to vitrify or crystallize the sealing glass layers 3 and 5. The firing conditions will depend upon the sealing glass employed, and will be apparent to persons skilled in the art.

As previously mentioned, mixtures of high boiling point solents can be employed in this invention. This may be desirable when the conditions during the drying step interposed between the various coats of sealant differ from the aforementioned conditions of about 120°–200° F. for about 5–10 minutes. In one instance, for example, it was found that the use of P-400 as the sole high boiling point solvent resulted in a fired glaze which out-gassed on heating to crystallization temperature. As a consequence, the hermeticity of the fired glaze was unsatisfactory. This was apparently due to a heating step shorter than about 5–10 minutes. It was found that the problem could be corrected by substituting P-200 for all or part of the P-400.

The vehicle and printing paste of this invention can be prepared by conventional mixing and blending techniques. The binder is generally dissolved in a mixture of the solvents by mixing until clear. The inorganic particulate material is then added to the resulting vehicle and mixed or milled until uniformly wetted and dispersed in the vehicle. High-speed mixers or three-roll mills can conveniently be used. The viscosity of the resulting paste can be adjusted by adding additional vehicle to lower the viscosity, or adding additional inorganic, particulate material to raise the viscosity. In the latter event, remilling may be necessary to obtain a homogeneous, uniformly wetted paste.

The term "sealing glass" is well understood in the microelectronic package art. The expression is used herein in accordance with its conventional meaning. That is to say, the term sealing glass is to be understood to mean a glass typically used in the microelectronic package art which is electronically insulating in nature, and which has a fiber softening point less than about 500° C.

Those skilled in the art will recognize that the exact nature of the sealing glass will in part be dictated by the thermal expansion characteristics of the substrate to which the improved printing paste of this invention is to be applied. The substrate employed in this invention can be any of the well-known ceramic substrates conventional in the art. For best results, it is preferred to use ceramic substrates having a coefficient of thermal expansion (0°–300° C.) of less than about $100 \times 10^{-7}$ in./in./° C. Examples of the ceramic substrates conventionally used in the microelectronic circuitry art are the aluminas, the beryllias, the hafnias, cordierite ([Mg, Fe] $Al_4Si_5 O_{18}$), steatite (hydrous $MgSiO_4$), olivine [$(MgFE)_2SiO_4$] and mullite ($3Al_2O_3.2SiO_2$). The coeficients of thermal expansion (0°–300° C.) for these conventional substrates are listed in the following table:

TABLE IV

| Ceramic substrate | *($\times 10^{-7}$ in./in./° C.) |
|---|---|
| Aluminas | 65–85 |
| Beryllias | About 95 |
| Hafnia | About 97 |
| Cordierite | About 30 |
| Steatites | 77–82 |
| Forsterite | About 99 |
| Mullite | About 42 |

* At least from 0–300° C.

A particularly preferred substrate contemplated for use in the environment of this invention is an alumina substrate comprised of about 96 weight percent $Al_2O_3$, which is a conventional substrate used in the microelectronic circuitry art, and which has a coefficient of thermal expansion of about $79 \times 10^{-7}$ in./in./° C.

Thus, the sealing glass compositions employed in this invention generally have a thermal coefficient of expansion of about $25 - 130 \times 10^{-7}$ in./in./° C. (0°–300° C.). Preferably the coefficient is from about $45-80 \times 10^{-7}$ in./in./° C. (0°–300° C.), and in the most preferred instances, where a conventional alumina substrate is employed, the coefficient is about 60 – 75 × $10^{-7}$ in.-/in./° C. (0°–300° C.).

The sealing glass employed can be any sealing glass conventional in the microelectronic circuitry art, including those used in conductive, resistive and dielectric microelectronic printing pastes. Typically, lead-zinc-borate glasses, lead borosilicate glasses, and lead-barium-borosilicate glasses can be employed.

A preferred sealing glass comprises about 94.4 weight percent of the following components expressed in weight percent of oxide ingredients of about the following percentages:

| | |
|---|---|
| PbO | 71.2% |
| ZnO | 15.9% |
| $B_2O_3$ | 10.0% |
| $SiO_2$ | 1.9% |
| SnO | 1.0% | and about 5 weight percent inert refractory oxide, and about 0.6 weight percent inert stain as colorant.

A particularly preferred solder or sealing glass for the purposes of this invention is that disclosed in commonly owned application Ser. No. 219,524 filed Jan. 20, 1972, now abandoned. Generally speaking, the sealing glasses disclosed in this application are those formed by admixing: a) 0–100% by weight, and preferably about 0.5–3% by weight, of a vitreous powdered glass composition comprising by weight about: 33–38% PbO; 8–16% $SiO_2$; 22–31% ZnO; 15–23% $B_2O_3$ and 5–10% BaO with b) 0–100% by weight, and preferably about 97  99.5% by weight, of a powdered glass comprised of by weight about: 60–72% PbO; 16–26% $B_2O_3$ and 4–18% ZnO. Component b) is preferably formulated by (1) forming a substantially homogeneous glass flux powder comprised of by weight about: 82–88% PbO and 12–18% $B_2O_3$ (2) admixing about 72–84% by weight of said powdered flux with about 16–28% by weight of powdered zinc borate, (3) melting the admixture to a substantially homogeneous glass, and (4) forming said glass into a powder. The sealing glass so formed has a coefficient of expansion compatible with ceramic substrates, and is readily fired to an exceptionally strong, substantially hermetic, crystallized seal at temperatures of from about 490°–700° C. The entire disclosure of application Ser. No. 219,524 filed Jan. 20, 1972, is incorporated herein by reference.

Also preferred are the solder glass compositions disclosed in Application Ser. No. 102,886, filed Dec. 30, 1970 and issued Dec. 11, 1975 as U.S. Pat. No. 3,778,242. The entire disclosure of this co-pendng application is incorporated herein by reference. The solder glass composition comprises about 5–15 wherein percent of a refractory oxide, about 0.0001–0.03 weight percent of a precrystallized lead-zinc-borate glass, and about 85–95 weight percent of an uncrystallized but crystallizable lead-zinc-borate glass. All particulate matter is less than about 100 U.S. Series Sieve screen in size. The solder glass composition is capable of being fired at about 400°–500° C. for about 1–60 minutes to produce a substantially completely crystallized, hermetic seal. These solder glass compositions are especially useful with the aforementioned alumina ceramics.

Persons skilled in the art will also recognize that the particle size of the constituents of the glass sealant is generally controlled to permit the formation of a uniform coating having good cosmetic properties. Typically, in the case of solder glasses, the particle size is such that about 90 weight percent passes a −400 mesh U.S. Screen Sieve size.

The microelectronic package is fired to vitrify or crystallize the sealing glass layers to thereby obtain a hermetic package. Persons skilled in the art will recognize that firing times, temperatures and atmospheric conditions in the furnace will vary depending upon the sealing glass employed. Typically, the temperature during this firing step is about 500°–600° C., and the firing step is conducted in about 5–10 minutes. Since the silicon chip is generally heat sensitive, persons skilled in the art will, of course, recognize that the sealing glass must be fireable at a time temperature below that at which the microelectronic package will be damaged.

The advantages of this invention will be more fully appreciated by reference to the following examples in which all parts, proportions, percentages and ratios are by weight unless otherwise indicated.

EXAMPLE 1

An interesting aspect of this invention is that the substitution of P-400 for a portion of Terpineol 318 in a conventional printing paste does not substantially change the viscosity of the paste in which the vehicle is used. Listed below are several printing paste formulations according to this invention, and the viscosity of each. In each instance, the printing paste can be prepared by mixing the sealing glass in the vehicle and milling the resulting mixture in three passes through a 3-roll mill.

TABLE V

| | | 12% Vehicle | | Viscosity Brookfield | |
|---|---|---|---|---|---|
| | | | P400 | | |
| Sealing* Glass | Dow Resin 276V2 | Terpineol 318 | Polypropylene Glycol | TE Sindle 5RPM | 50RPM |
| 88% | 30% | 70% | 0% | 74,000 | 30,920 |
| 88% | 30% | 63% | 7% | 85,200 | 35,360 |
| 88% | 30% | 56% | 14% | 72,000 | 29,680 |
| 88% | 30% | 42% | 28% | 82,400 | 33,040 |
| 88% | 30% | 28% | 42% | 86,000 | 32,640 |

*5% inert refractory oxide, 0.6% stain, and 94.4% of a mixture composed of: PbO 71.2%, ZnO 15.9%, $B_2O_3$ 10.0%, $SiO_2$ 1.9%, SnO 1.0%.

EXAMPLE 2

Another interesting aspect of this invention is the stability of the viscosity of the improved printing paste over a period of time. A 200 lb. batch of printing paste is prepared. The paste comprises 88T of the sealing glass employed in Example 1 and 12% of a vehicle according to this invention. The vehicle comprises 30% Dow Resin 276-V2, 35% Terpineol 318 and 35% P-400. Viscosities are shown below.

TABLE VI

| | | After 2 days | After 6 days | After 7 days |
|---|---|---|---|---|
| at 50RPM with TE Spindle | 42,500 cps | 42,300 cps | 41,500 cps | 41,600 cps |

| | After 8 days | After 20 days |
|---|---|---|
| | 39,200 cps | 42,400 cps |

A similar paste is made without P-400 has a viscosity of 41,000 ± 2,000 cps. The results show the stability of viscosity over a period of time, and the fact that it is about the same viscosity of a similar paste made without P-400.

With 1 part P-400/1 part Terpineol 318 constant drying conditions were achieved in a production facility. When dryers were turned up to full capacity all of the Terpineol was removed. A constantly dried ceramic was achieved whether the line was filled with parts or whether only a few parts came through. This meant that screening was accomplished on uniformly dried parts.

A further advantage of this paste was that the flow of paste once printed was minimal, thus tending not to flow into unwanted areas. Since the P-400 has a low vapor pressure, drying in the screens did not occur. As a consequence, clogging was also minimized. With a one to one ratio of P-400/Terpineol 318, the final layer was dried thoroughly before firing.

The advantages of this invention will be readily apparent to persons skilled in the art. There is provided an improved vehicle which can be readily formulated into a printing paste. The improved printing paste of this invention exhibits excellent screenability and a relatively constant rate of evaporation of solvent during the drying step interposed between coats in multiple pass printing. Furthermore, each paste layer has a substantially uniform wetness over its entire surface area. The improved paste of this invention exhibits very little flow in the absence of pressures above atmospheric pressure thereby minimizing contact with undesired areas. Also, the substantial absence of flow results in the maintenance of the resolution of lines, images and patterns printed from the paste. Additionally, the improved printing paste of this invention contains few voids, making it possible to fire the coats to thereby form a strong, hermetic seal.

The rates of evaporation of solvents employed in the paste of this invention make it possible to obtain the desired degree of wetness between coats. The pastes of this invention are especially suitable for use in the microelectronic package art where the drying step interposed between coats is about 120°–200° F. for about 5–10 minutes. The viscosity, thixotropy and flow characteristics of the paste of this invention are especially desirable for use of the pastes in the microelectronic package art.

Of the particularly preferred high boiling point solvents employed in this invention, P-400 also provides lubricating qualities to the past thereby minimizing screen clogging.

Also, due to the relatively low vapor pressures of the high boiling point solvents at screening temperatures, screen clogging caused by premature drying of the paste is minimized. Surprisingly, these solvents can be substituted in part for the low boiling point solvents with very little or no change in the viscosity of the paste. These pastes exhibit stable viscosities over a period of time, which is desirable from an economic point of view.

Finally, it is possible by means of this invention to strike a balance between excellent screening characeristics and optimum drying characteristics of the pastes.

What is claimed is:

1. A multiple pass method of applying printing paste upon a substrate comprising the steps of:

applying to a substrate a first coat of a printing paste including about 80–92 weight percent of at least one finely divided, particulate inorganic material which can be fused, vitrified or crystallized at temperatures above about 200° F. and about 8–20 weight percent of a liquid vehicle comprising:

a thermally stable organic binder which practically completely pyrolyzes while processing the property of being substantially thermally stable at temperatures below about 200° F. and constituting about 10–35 weight percent of said vehicle, and a solvent system for said binder comprising a low boiling temperature organic solvent constituting about 30–70 weight percent of said vehicle and having a vapor pressure of less than about 2 mm Hg at a temperature in the temperature range about 20°–25° C. and having a vapor pressure in the vapor pressure range of about 2–100 mm Hg at a temperature in the temperature range of about 120° – 200° F., and a high boiling temperature organic solvent constituting about 20–40 weight percent of said vehicle and having a vapor pressure of about 1 mm Hg or less at a temperature in the temperature range of about 120° – 200° F. and having a vapor pressure in the vapor pressure range of about 2–100 mm Hg at a temperature in the temperature range of above about 200° F. to about 400° F.;

exposing said first coat to a temperature in the temperature range of about 120°–200° F. for a time sufficient to remove substantially all of said low boiling temperature solvent without substantially removing said high boiling temperature solvent, thereafter superposing on said first coat an additional coat of printing paste having the above-defined characteristics of said first coat, exposing said superposed additional coat to a temperature in the temperature range of about 120°–200° F. for a time sufficient to remove substantially all of said low boiling temperature solvent from said superposed additional coat, subsequently exposing said first coat and said superposed additional coat to a temperature in the temperature range of above about 200° F. for a time sufficient to remove substantially all of said high boiling temperature solvent therefrom and practically completely pyrolyze said thermally stable binder and to fuse, vitrify or crystallize said particulate inorganic material.

2. The method according to claim 1, with said first coat and said additional coat being applied in a predetermined thickness selected to provide a resulting coating thickness of about 5–6 mils thickness upon removal of substantially all of said low boiling temperature organic solvent therefrom.

3. The method according to claim 1, wherein said substrate consists essentially of alumina.

4. The method according to claim 1, wherein said thermally stable organic binder is selected to possess a pyrolyzation temperature in the temperature range of about 150° – 400° C., and wherein said step of subsequently exposing said first coat and said additional coat to a temperature in the temperature range of above about 200° F. includes exposing said first coat and said additional coat to a temperature in the temperature range of about 150° – 400° C. to pyrolyze essentially all of said thermally stable organic binder in each said coat.

5. The method according to claim 1, wherein said finely divided, particulate inorganic material and said substrate are selected to possess properties compatible for use in microelectronic devices.

6. The method according to claim 1, wherein of the total amount of said thermally stable organic binder and said organic solvent system, said organic binder comprises about 10–30 weight percent, said low boiling temperature organic solvent comprises about 40–70 weight percent and said high boiling temperature organic solvent comprises about 20–40 weight percent.

7. The method according to claim 6, wherein said thermally stable organic binder is a poly (alpha-methyl) styrene having a molecular weight of about 250–1000, said low boiling temperature organic solvent is a mixture of isomeric terpineols composed predominantly of alpha-terpineol with minor amounts of beta-terpineol and gamma-terpineol, and said high boiling temperature organic solvent is diisobutyl adipate or a polypropylene glycol having an average molecular weight of about 200 or 400 or mixtures of polypropylene glycols having such average molecular weights.

8. The method according to claim 7, wherein said thermally stable organic binder has a specific gravity at 60/60° C. of about 1.01 and a refractive index at 60° C. of about 1.58.

9. The method according to claim 1, wherein said thermally stable organic binder is a poly (n-butyl methacrylate), said low boiling temperature organic solvent is a mixture of isomeric terpineols composed predominantly of alpha-terpineol with minor amounts of beta-terpineol and gamma-terpineol, and said high boiling temperature organic solvent comprises diisobutyl adipate.

10. The method according to claim 9, wherein of the total amount of said liquid vehicle said terpineol mixture comprises about 50 weight percent and a mixture of said thermally stable organic binder and said diisobutyl adipate comprise about 50 weight percent, and wherein the weight ratio of said diisobutyl adipate to said poly (n-butyl methacrylate) is about 3:1.

11. The method according to claim 1, wherein said printing paste consists essentially of about 10–14 weight percent of said thermally stable organic binder and about 86–90 weight percent of said particulate inorganic material as a sealing glass.

12. The method according to claim 11, wherein said printing paste has a viscosity of about 38,000–46,000 centipoise.

13. The method according to claim 1, wherein said thermally stable organic binder comprises poly(alpha-methyl) styrene having a molecular weight of about 259–1000.

14. The method according to claim 1, wherein said thermally stable organic binder comprises poly(alpha-methyl) styrene having a molecular weight of about 250–1000, and wherein said low boiling temperature organic solvent comprises a mixture of isomeric terpineols composed predominantly of alpha-terpineol with minor amounts of beta-terpineol and gamma terpineol, and wherein said high boiling temperature organic solvent comprises polypropylene glycol having an average molecular weight of about 200 or 400 or mixtures of polypropylene glycols having such average molecular weights.

15. The method according to claim 1, wherein said low boiling temperature organic solvent comprises a mixture of isomeric terpineols composed predominantly of alpha-terpineol with minor amounts of beta-terpineol and gamma-terpineol.

16. The method according to claim 1, wherein said high boiling temperature organic solvent comprises diisobutyl adipate.

17. The method according to claim 1, wherein said high boiling temperature organic solvent comprises polypropylene glycol having an average molecular weight of about 200 or 400 or mixtures of polypropylene glycols having such molecular weights.

18. The method according to claim 1, wherein said printing paste has a viscosity of about 38,000–46,000 centipoise.

19. A multiple pass method of applying printing paste upon a substrate comprising the steps of:
    applying to a substrate a first coat of a printing paste including about 80–92 weight percent of at least one finely divided, particulate inorganic material which can be fused, vitrified, or crystallized at temperatures above about 200° F. and about 8–20 weight percent of a liquid vehicle comprising:
    a thermally stable organic binder which practically completely pyrolyzes while possessing the property of being substantially thermally stable at temperatures below about 200° F. and constituting about 10–35 weight percent of said vehicle, and
    a solvent system for said binder, comprising a low boiling temperature organic solvent constituting about 30–70 weight percent of said vehicle and having a vapor pressure of less than about 2 mm Hg at a temperature in the temperature range about 20°–25° C. and having a vapor pressure in the vapor pressure range of about 2–100 mm Hg at a temperature in the temperature range of about 120° – 200° F., and a high boiling temperature organic solvent constituting about 20–40 weight percent of said vehicle and having a vapor pressure of about 1 mm Hg or less at a temperature in the temperature range of about 120° –200° F. and having a vapor pressure in the vapor pressure range of about 2–100 mm Hg at a temperature in the temperature range of above about 200° F. to about 400° F.;
    exposing said first coat to a temperature in the temperature range of about 120° – 200° F. for a time sufficient to remove substantially all of said low boiling temperature solvent, without substantially removing said high boiling temperature solvent
    thereafter superposing on said first coat a plurality of additional costs of printing paste having the above-defined characteristics of said first coat and successively exposing each of said superposed additional coats to a temperature in the temperature range of about 120° – 200° F for a time sufficient to remove substantially all of said low boiling temperature solvent without substantially evaporating said high boiling temperature solvent prior to applying the next additional superposed coat,
    subsequently exposing said first coat and each of said plurality of additional coats to a temperature in the temperature range of above about 200° F. for a time sufficient to remove substantially all of said high boiling temperature solvent therefrom and practically completely pyrolyze said thermally stable binder and to fuse, vitrify or crystallize said particulate inorganic material.

* * * * *